US007818085B1

(12) United States Patent
Chang

(10) Patent No.: US 7,818,085 B1
(45) Date of Patent: Oct. 19, 2010

(54) SYSTEM FOR CONTROLLING THE PROCESSING OF AN INTEGRATED CIRCUIT CHIP ASSEMBLY LINE

(75) Inventor: Bo Soon Chang, Cupertino, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 549 days.

(21) Appl. No.: 11/042,701

(22) Filed: Jan. 24, 2005

Related U.S. Application Data

(62) Division of application No. 10/085,752, filed on Feb. 27, 2002, now Pat. No. 6,901,984.

(60) Provisional application No. 60/272,283, filed on Feb. 27, 2001.

(51) Int. Cl.
*G06F 19/00* (2006.01)

(52) U.S. Cl. .................. 700/121; 156/351; 438/107; 438/112; 438/113; 700/96; 700/117

(58) Field of Classification Search ............... 700/121, 700/95, 96, 117; 156/351, 584; 438/106, 438/107, 110–113; 710/105
See application file for complete search history.

(56) References Cited

U.S. PATENT DOCUMENTS

| 3,814,895 | A |   | 6/1974  | Fredriksen           |
|-----------|---|---|---------|----------------------|
| 4,214,364 | A | * | 7/1980  | St. Louis et al. ........ 29/827 |
| 4,301,958 | A | * | 11/1981 | Hatakenaka et al. ..... 228/4.5 |
| 4,674,670 | A |   | 6/1987  | Watanabe et al.      |
| 4,796,194 | A | * | 1/1989  | Atherton ............ 700/103 |
| 4,915,565 | A |   | 4/1990  | Bond et al.          |
| 4,928,002 | A |   | 5/1990  | Corley et al.        |
| 5,173,766 | A |   | 12/1992 | Long et al.          |
| 5,336,931 | A |   | 8/1994  | Juskey et al.        |
| 5,499,717 | A |   | 3/1996  | Hayashi              |
| 5,541,524 | A |   | 7/1996  | Tuckerman et al.     |
| 5,547,537 | A |   | 8/1996  | Reynolds et al.      |

(Continued)

FOREIGN PATENT DOCUMENTS

JP        57167657 A2    10/1982

(Continued)

OTHER PUBLICATIONS

Ghiselli et al., "Practical aspects og the GEM Model for Factory Automation", 1900 IEEE.*

(Continued)

*Primary Examiner*—Paul L Rodriguez
*Assistant Examiner*—Carlos Ortiz Rodriguez

(57) ABSTRACT

A method and system for controlling the processing of an IC chip assembly line using a central computer system and a common communication protocol. In one embodiment, a manufacturing execution system (MES) is used as the computer system and the communications protocol is the standard semi equipment communications standard/generic equipment model (SECS/GEM). One or more equipment cell controllers (CC) may be used to communicate between the MES a plurality of in-line substations which comprise the assembly line. Automated vision camera systems may also communicate information to the MES via the CCs. In one embodiment, the MES maintains a database in memory comprising processing history of a die-strip and results of automated die-strip examination from the vision camera systems. In one embodiment, the die-strip may be of a ball grid array (BGA) type.

23 Claims, 15 Drawing Sheets

U.S. PATENT DOCUMENTS

| | | | |
|---|---|---|---|
| 5,549,716 A | | 8/1996 | Takahashi et al. |
| 5,657,252 A | * | 8/1997 | George .................... 702/83 |
| 5,851,664 A | | 12/1998 | Bennett et al. |
| 5,865,319 A | | 2/1999 | Okuda et al. |
| 5,915,231 A | | 6/1999 | Beffa |
| 5,943,551 A | | 8/1999 | Schemmel et al. |
| 6,045,652 A | | 4/2000 | Tuttle et al. |
| 6,049,624 A | * | 4/2000 | Wilson et al. ............... 382/145 |
| 6,096,093 A | | 8/2000 | Caywood et al. |
| 6,105,783 A | | 8/2000 | Sato |
| 6,129,278 A | | 10/2000 | Wang et al. |
| 6,154,714 A | | 11/2000 | Lepejian |
| 6,173,750 B1 | | 1/2001 | Davis et al. |
| 6,230,719 B1 | * | 5/2001 | Wensel .................... 134/1.1 |
| 6,256,549 B1 | | 7/2001 | Romero et al. |
| 6,320,155 B1 | | 11/2001 | Barnett |
| 6,337,221 B1 | | 1/2002 | Kim et al. |
| 6,367,042 B1 | | 4/2002 | Phan et al. |
| 6,392,286 B1 | | 5/2002 | Jin et al. |
| 6,392,427 B1 | | 5/2002 | Yang |
| 6,465,743 B1 | | 10/2002 | Owens |
| 6,522,940 B1 | | 2/2003 | Erck et al. |
| 6,549,821 B1 | * | 4/2003 | Farnworth et al. .......... 700/120 |
| 6,566,745 B1 | | 5/2003 | Beyne et al. |
| 6,574,858 B1 | | 6/2003 | Hembree |
| 6,587,744 B1 | * | 7/2003 | Stoddard et al. ............ 700/121 |
| 6,708,074 B1 | * | 3/2004 | Chi et al. .................... 700/121 |
| 6,730,532 B1 | | 5/2004 | Chang et al. |
| 6,730,545 B1 | | 5/2004 | Chang et al. |
| 6,806,725 B2 | | 10/2004 | Tsui et al. |
| 6,875,640 B1 | | 4/2005 | Farnworth et al. |
| 6,896,186 B2 | * | 5/2005 | Kudo .................... 235/462.11 |
| 6,901,984 B1 | | 6/2005 | Chang |
| 6,931,298 B1 | | 8/2005 | Chang |
| 6,937,753 B1 | * | 8/2005 | O'Dell et al. ............... 382/141 |
| 7,031,791 B1 | | 4/2006 | Chang |
| 7,045,387 B1 | | 5/2006 | Chang et al. |
| 7,105,377 B1 | | 9/2006 | Chang et al. |
| 7,698,015 B1 | | 4/2010 | Chang |
| 2001/0032706 A1 | | 10/2001 | Wensel |
| 2003/0106209 A1 | * | 6/2003 | Farnworth et al. ............ 29/833 |

FOREIGN PATENT DOCUMENTS

| | | |
|---|---|---|
| JP | 06224293 A2 | 8/1994 |

OTHER PUBLICATIONS

DeBolt et al., "Implementation of the SEMI "Generic Equipment Model" using object-based cell technology", 1991 IEEE.*

Nguyen, Kevin, "The Development and Implementation of a Cell Controller Framework", 1993 IEEE.*

Deng et al., "Development of an object-based equipment controller for semiconductor equipment communications", 1999 IEEE.*

Pedro et al., "Using electronic strip mapping for tracking defects in a fully integrated assembly and test line", Cypress Semiconductor Philippines Inc.*

Chang et al., Critical success factors in the implementation of a computer integrated manufacturing (CIM) project for CSP-BGA Packaging.*

Chang et al., "The Trailer: A fully integrated assembly-test-finish line for matrix array molded array BGA", Cypress Semiconductor, 1999.*

USPTO Notice of Allowance for U.S. Appl. No. 10/085,757 dated May 17, 2005; 2 pages.

USPTO Notice of Allowance for U.S. Appl. No. 10/085,757 dated Nov. 10, 2004; 6 pages.

USPTO Final Rejection for U.S. Appl. No. 10/085,757 dated Jul. 2, 2004; 8 pages.

USPTO Non-Final Rejection for U.S. Appl. No. 10/085,757 dated Feb. 5, 2004; 9 pages.

USPTO Miscellaneous Action for U.S. Appl. No. 10/085,757 dated Mar. 29, 2002; 2 pages.

USPTO Notice of Allowance for U.S. Appl. No. 10/085,752 dated Mar. 14, 2005; 4 pages.

USPTO Notice of Allowance for U.S. Appl. No. 10/085,752 dated Oct. 1, 2004; 7 pages.

USPTO Non-Final Rejection for U.S. Appl. No. 10/085,752 dated May 7, 2004; 9 pages.

USPTO Requirement for Restriction/Election for U.S. Appl. No. 10/085,752 dated Jan. 13, 2004; 5 pages.

USPTO Miscellaneous Action for U.S. Appl. No. 10/085,752 dated Mar. 28, 2002; 2 pages.

USPTO Notice of Allowance for U.S. Appl. No. 10/085,716 dated Dec. 5, 2003; 7 pages.

USPTO Non-Final Rejection for U.S. Appl. No. 10/085,716 dated Jul. 30, 2003; 9 pages.

USPTO Requirement for Restriction/Election for U.S. Appl. No. 10/085,716 dated Apr. 21, 2003; 5 pages.

T. Olson, "Emerging Package-Less Strip Designs Demand Innovative Manufacturing Approaches;" Semiconductor Magazine, vol. 1, Issue 4, Apr. 2000, P58; 2 pages.

L. Estacio, "Cypress Semiconductor Leads the Way with Advance Strip Level Tracking;" Semiconductor Magazine, vol. 1, Issue 4, Apr. 2000, P60; 1 page.

USPTO Notice of Allowance for U.S. Appl. No. 10/086,050 dated Dec. 5, 2003; 7 pages.

USPTO Requirement for Restriction/Election for U.S. Appl. No. 10/086,050 dated Sep. 29, 2003; 5 pages.

USPTO Miscellaneous Action for U.S. Appl. No. 10/086,050 dated Apr. 2, 2002; 2 pages.

USPTO Notice of Allowance for U.S. Appl. No. 10/824,006 dated May 2, 2006; 7 pages.

USPTO Final Rejection for U.S. Appl. No. 10/824,006 dated Oct. 31, 2005; 16 pages.

USPTO Non-Final Rejection for U.S. Appl. No. 10/824,006 dated Apr. 18, 2005; 13 pages.

USPTO Notice of Allowance for U.S. Appl. No. 10/838,791 dated Dec. 8, 2005; 7 pages.

USPTO Non-Final Rejection for U.S. Appl. No. 10/838,791 dated Jul. 27, 2005; 6 pages.

USPTO Requirement for Restriction/Election for U.S. Appl. No. 10/838,791 dated Feb. 25, 2005; 5 pages.

USPTO Notice of Allowance for U.S. Appl. No. 10/086,051 dated Nov. 9, 2005; 8 pages.

USPTO Non-Final Rejection for U.S. Appl. No. 10/086,051 dated Jun. 17, 2005; 23 pages.

USPTO Notice of Allowance for U.S. Appl. No. 11/087,484 dated Nov. 23, 2009; 7 pages.

USPTO Final Rejection for U.S. Appl. No. 11/087,484 dated Sep. 4, 2009; 26 pages.

USPTO Non-Final Rejection for U.S. Appl. No. 11/087,484 dated Mar. 9, 2009; 30 pages.

USPTO Non-Final Rejection for U.S. Appl. No. 11/087,484 dated May 31, 2006; 37 pages.

USPTO Non-Final Rejection for U.S. Appl. No. 11/087,484 dated Feb. 1, 2006; 16 pages.

Lee et al., "Integrated Assembly and Strip Test of Chip Scale Packages," Chip Scale Review, Mar.-Apr. 2000, <http://www.chipscalereview.com/archives/ES/issues/0300/assembly20.html> and <http://www.national.com/nationaledge/may01/582.html> Accessed May 25, 2006; 9 pages.

Choon et al., "Automation/Integration Program in TAP Reality Vs. Vision," Test Assembly & Packaging Automation & Integration '99 Conference, 1999, pp. A1-A9; 9 pages.

Nikkei Electronics Asia, Circulation/Bonus Distribution, <http://www.nikkeibp.com/nea/media2001/circulat.html> Accessed May 25, 2006; 3 pages.

* cited by examiner

IN-LINE FRONT-OF-LINE PORTION
300A

IN-LINE END-OF-LINE PORTION
300B

| V/C 302 | | V/C 302 | | V/C 302 |

| MOLD 314 | PMC 316 | SBA 318 | SAW 320 | SORT 322 |

FIGURE 3B

SYSTEM FOR CONTROLLING THE PROCESSING OF AN INTEGRATED CIRCUIT CHIP ASSEMBLY LINE

RELATED UNITED STATES APPLICATION

This application claims priority to the provisional U.S. Patent Application Ser. No. 60/272,283, entitled "Automated and/or Integrated Process and/or Equipment for Assembling, Packaging, Finishing, and/or Testing," filed Feb. 27, 2001, and assigned to the assignee of the present application which is hereby incorporated by reference.

This application is a divisional of and claims priority to U.S. patent Ser. No. 10/085,752 entitled "A Method And System For Controlling The Processing Of An Integrated Circuit Chip Assembly Line Using A Central Computer System And A Common Communication Protocol," by Chang, filed on Feb. 27, 2002 now U.S. Pat. No. 6,901,984, which is incorporated herein by reference.

FIELD OF THE INVENTION

The present invention relates to the field of IC chip manufacturing. More particularly, embodiments of the present invention relate to a method of back-end manufacturing IC packaged chips using an integrated automated back-end IC manufacturing assembly.

BACKGROUND ART

Conventional back-end IC manufacturing facilities, at contract assembly houses as well as several original equipment manufacturers (OEMs), have a moderate to low level of automation and equipment integration. These lines typically require several manual steps and depend upon operator intervention for many, if not nearly all, operation, maintenance, lot management and inspection steps. Since this is typically a batch type process, there maybe a high level of work-in-progress (WIP) inventory, as well as relatively high cycle times. This type of factory management may not be suitable for manufacturing where flexibility is key, and daily operation may require several changeovers in die, package and leadframe types.

Presently, the back-end manufacturing process for ICs (i.e. from manufactured wafer to tested and packaged die) is labor intense. In order to manufacture an IC chip, in the back-end, from the initial step of wafer reception to the packaging and shipping of the finished chip, there are many personnel and specialized pieces of equipment involved. Further, the process of back-end manufacturing an IC chip is a relatively long one. The complete process typically takes anywhere from four to six weeks to obtain a final packaged chip, and generally takes on the order of 1.5 to 2 weeks when using special "rush" or "hot lot" procedures.

Due to the length of the back-end manufacturing process and the required manpower, IC (IC) chips are generally manufactured in batches. That is, the process of back-end manufacturing a single IC is done on a large scale with individual large batches running through discrete process steps. This large scale is utilized to add a standard of efficiency to an otherwise complex process. For instance, a wafer that is received from an outside vendor is cut into strips. Each strip may contain approximately 200 die, and there may be 50 strips in a batch. Therefore, a typical batch of ICs, formed through a single back-end IC manufacturing process, may contain 10,000 or more IC chips.

An embodiment of a conventional batch-oriented back-end IC manufacturing process is illustrated in FIG. 1. This embodiment illustrates the length of a conventional back-end IC manufacturing process. Batches of chips move from one stage of the process to the next. In block diagram 100, the back-end manufacturing line includes front-of-line portion 100A, end-of-line portion 100B, test 128, and finish portion 100C. The back-end IC manufacturing process begins with die attach station (D/A) 110. Although a die preparation process is required, this is typically done outside front-of-line portion 100A. Furthermore, the die preparation process may take place in a different location than the rest of the back-end IC manufacturing process.

Front-of-line portion 100A includes die attach station (D/A) 110, cure station 112, plasma treatment station 114, wire bond station (W/B) 116, and another plasma station 118 (typically a plasma cleaning station). This back-end IC manufacturing process includes many aspects which require human material handling stations (HM) 150. HM 150 steps are represented in FIG. 1 with arrows. These HM 150 steps include transferring the batch from one step of the process to the next, as well as between specific manual visual inspection stations (MVI) 105.

In the front-of-line portion 100A, the cure station 112 may carry out a curing process in a machine designed to heat a batch of strips to a temperature of about 150 degrees Celsius, for a period of one hour, in order to cure the glue used in the die attach step. This cure station 112 is followed by a plasma station 114 cleaning step utilizing oxygen ($O_2$) or Argon (Ar). The next step is wire bond station (W/B) 116 followed by MVI 105. Another plasma station 118 cleaning step is done following wire bond station (W/B) 116 and another MVI 105. The plasma station 118 cleaning step is similar to plasma station 114 cleaning step, and each plasma step may last anywhere from 30 minutes to one hour.

With reference still to FIG. 1, back-end manufacturing line 100 continues with an end-of-line portion 100B where need for human interaction also exists. End-of-line portion 100B begins with mold station 120. HM 150 is utilized to move the batch through each MVI 105. The next step in end-of-line portion 100B is post mold cure station (PMC) 122. PMC 122 is a curing step which requires a temperature of 175-degree Celsius and a timeframe of approximately 5 hours. After PMC 122, the strip undergoes solder ball attach station (SBA) 124. Following SBA 124, MVI 105 takes place to ensure proper attachment of the ball to each strip in the batch. The batch is then processed through saw station 126. Saw station 126 separates the batch into individual IC chips. The final step in end-of-line portion 100B is MVI 105 of the completed saw station 126 step. Throughout the back-end manufacturing process, MVI 105 normally includes additional quality control and assurance measures.

Following the completion of end-of-line portion 100B, back-end manufacturing line 100 continues with test portion 128. In test portion 128, as illustrated in the previous portions, the need for human interaction includes human handling during both the testing, and inspecting phases.

With reference still to FIG. 1, back-end manufacturing line 100 further illustrates the final portion of the back-end IC manufacturing process. The final portion is illustrated as finish portion 100C. Finish portion 100C includes mark station 130, dry bake station 132, and tape and reel station (T/R) 134. Most significantly, dry bake station 132 is a 24-hour dry bake step performed prior to T/R 134. Dry bake station 132 is required by modern back-end IC manufacturing processes in order to meet the stringent moisture sensitivity level (MSL) 3 IC chip packaging requirements. Specifically, MSL 3 is a moisture level benchmark that meets demanding requirements placed on back-end IC manufacturers.

Therefore, in a typical back-end IC manufacturing line, a production cycle may span a period of four to six weeks. Moreover, the processing cycle may be done at the batch level which results in approximately 10,000 or more IC chips per stage. This batch level process results in a large inventory of on hand IC chips. In an effort to control production overruns, a manufacturer will normally use a build-to-forecast model based on contract back-end IC manufacturing techniques.

Disadvantages of the batch level process include the large minimum order size and the long timeframe for the manufacture of a specific type of IC. For example, if a customer requests an uncommon or highly demanded type of IC, e.g., one that is not in inventory, they would typically place a special order. In this case, a small order may not be economically worthwhile. Specifically, the batch level process is generally cost prohibitive unless the customer orders a specified minimum amount of product. Further, it generally takes a minimum of four to six weeks to process a special order. Moreover, this minimum time conventionally includes time to reset and/or maintain machinery, and/or instruct inspectors on expected differences in the back-end IC manufacturing process.

Another disadvantage of the conventional batch process is the multitude of procedures using human interaction with the batch in transporting the batch from stage to stage, or during certain stages, such as visual inspection (HM). These procedures include MVI, quality assurance (QA), and handling throughout the entire back-end IC manufacturing process. Specifically, MVI typically involves a pause in the back-end IC manufacturing process so that an operator can manually inspect the IC chip after a given step. MVI is done to ensure correct part placement, proper IC shape, elimination of excess material on the IC, etc. MVI, however, is error prone because it relies on human judgment and discrimination, and it may be tedious, and may require sustained or prolonged concentration, thereby introducing difficult practice for periods of time in excess of an hour or two, or over an entire workday.

Further, upon completion of the visual inspection, a QA examination takes place to ensure the MVI was done correctly. This QA examination further delays the back-end IC manufacturing process due to an increase in overall time spent on the redundant inspection. Another detrimental aspect of the MVI process is the human handling of the strips in the batch. As an inspector analyzes a die on a strip in the batch, they may inadvertently cause a defect. Thus, an inspector looking for defects may actually be creating them.

A further problem arises in batch back-end IC manufacturing in that a relatively large number of personnel are required, e.g., personnel to move the batch from point to point, personnel for MVIs, personnel for QA inspections, and personnel to operate each of the many processes required in typical IC back-end IC manufacturing. The average processing line may easily maintain a payroll of thirty-plus personnel. Therefore, the expense required per employee must be factored into the final cost of the IC chip.

Early efforts in equipment integration and automation result in "islands of automation" involving some automation at an individual equipment level, but not a high level of multi-equipment integration. Individual operation steps at the level of an individual piece of equipment had been automated to some degree, but still manual inspection, as well as manual lot movement and tracking remained typical. Further improvements in equipment and software capabilities have transitioned these islands to automation cells that handle large chunks of the assembly process. Each cell is a functional area and represents part of the total operation. However, a total solution has not been presented heretofore.

SUMMARY OF INVENTION

Thus a need exists for a method and system for controlling the processing of a IC chip assembly line using a central computer system and a common communication protocol. A further need exists for a method and system for controlling the processing of a IC chip assembly line using a central computer system and a common communication protocol, which can proficiently perform back-end IC manufacturing on a smaller scale of chips. A further need exists for a method and system for controlling the processing of a IC chip assembly line using a central computer system and a common communication protocol which can abbreviate the MVI and QA process while maintaining a higher quality of visual inspection. Still another need exists for a method and system for controlling the processing of a IC chip assembly line using a central computer system and a common communication protocol which is compatible with existing back-end IC manufacturing processes.

One embodiment of the present invention advances factory automation by implementing an advanced, fully integrated assembly and test lines capable of manufacturing ball grid array (BGA) packages (for example, molded BGA packages in a matrix array). The implementation has integrated the manufacturing process from die attach to tape and reel, with a reduced cycle time. This implementation enables a virtually "hands-free" production line with automated chip movement, testing, inspection and sorting as well as automated chip assembly.

The present invention provides, in various embodiments, methods to integrate a IC chip manufacturing assembly. Embodiments of the present invention also provide an integrated in-line back-end IC manufacturing assembly process, which proficiently performs IC packaging manufacturing on a smaller scale. The present invention further provides a method to integrate a back-end IC manufacturing assembly, which reduces the human-operated MVI and QA processes while maintaining a higher quality of visual inspection. The present invention also provides a method to integrate a back-end IC manufacturing assembly which requires fewer personnel on the manufacturing line. The present invention further provides a method to integrate a back-end IC manufacturing assembly, which is compatible with existing back-end IC manufacturing processes.

Generally, an embodiment is directed to an integrated assembly process that automatically moves small amounts of IC chips (e.g. a die strip) through packaging stages that span from receiving the IC dies to testing the packaged chip and tape and reel assembly. Herein, the processing of IC chips in a pipeline fashion is called "in-line" assembly because the individual chips (in small amounts) are moved from station to station very rapidly and are not delayed in batch fashion. In-line assembly is different from batch processing, in that, small amounts of chips move through the entire assembly process of the present invention (in a pipeline fashion) from one end to another without interruption or delay associated with batch processing. Handling, testing and processing the chips are also automated processes in accordance with the present invention to reduce and/or eliminate human interactions.

Specifically, in one embodiment, a manufacturing execution system (MES) is used as the computer system and the communications protocol is the standard semi equipment communications standard/generic equipment model (SECS/GEM). One or more equipment cell controllers (CC) may be used to communicate between the MES and a plurality of in-line substations which comprise the assembly line. Automated vision camera systems may also communicate information to the MES via the CCs. In one embodiment, the MES maintains a database in memory comprising processing history of a die-strip and results of automated die-strip examination from the vision camera systems. In one embodiment, the die-strip may be of a ball grid array (BGA) type.

In one embodiment, the various substations of the integrated in-line back-end IC manufacturing hardware are arranged in an assembly line format. Further, a software process monitors and controls the integrated in-line back-end IC manufacturing hardware. It is also appreciated that an automated reject management protocol is implemented from initial die attach through test and finish. Specifically, the reject management protocol maintains a strip process history which is updated via an electronic strip map database 620 throughout the manufacturing process using comprehensive strip level tracking procedure. The updates to the electronic strip map database 620 are received through a network hierarchy including automated visual camera technology, integrated cell controllers, and an overall manufacturing execution system. These elements virtually eliminate human manual intervention in the inspecting, testing and sorting of IC chips.

In one embodiment, a universal packaging process is applied to the in-line assembly line manufacturing process. Specifically, universal packaging utilizes the in-line subassemblies in conjunction with the integrated software processes to increase throughput time of a specific package size. A further benefit is realized with the streamlined transition of subassembly manufacturing specifications from one package size to another. In general, aspects of universal packaging allow package changeovers with minimal changeover times, thus allowing some amount of flexibility within package families. For example, in one embodiment, an exemplary changeover in the entire line from a 7 mm×7 mm package to any other package size may take less than thirty minutes.

BRIEF DESCRIPTION OF THE DRAWINGS

The accompanying drawings, which are incorporated in and form a part of this specification, illustrate embodiments of the invention and, together with the description, serve to explain the principles of the invention:

CONVENTIONAL ART

FIG. 3B is a block diagram illustrating an exemplary end-of-line portion of the novel integrated in-line back-end IC manufacturing line and method in accordance with one embodiment of the present invention.

Figure 1:
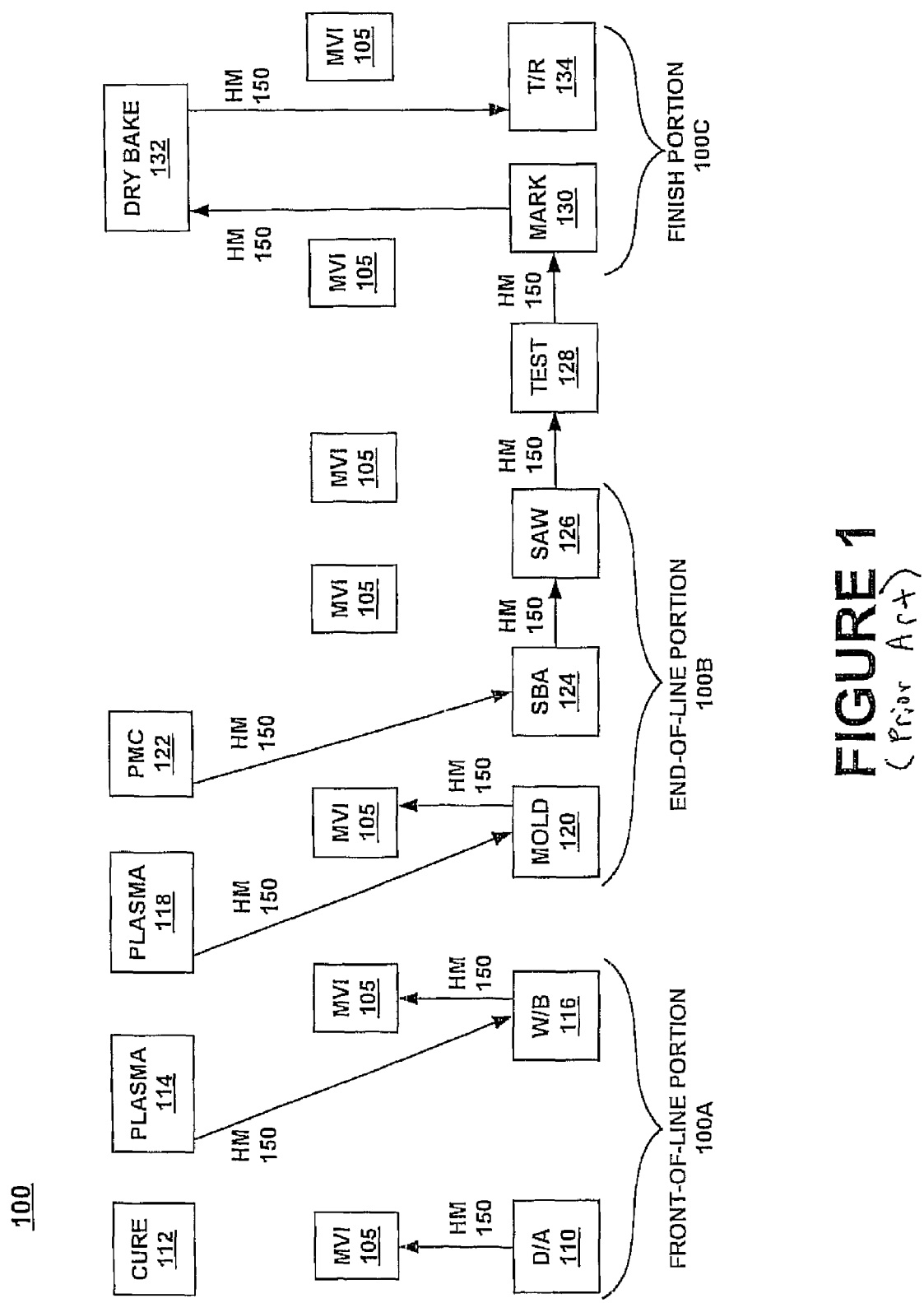
FIG. 1 is a block diagram illustrating a conventional batch processed back-end IC manufacturing line.

The drawings referred to in this description should be understood as not being drawn to scale except if specifically noted.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Moreover, some portions of the detailed descriptions which follow are presented in terms of procedures, logic blocks, processing and other symbolic representations of operations for fabricating IC structures. These descriptions and representations are the means used by those skilled in the art of IC fabrication to most effectively convey the substance of their work to others skilled in the art. In the present application, a procedure, logic block, process, or the like, is conceived to be a self-consistent sequence of steps or instructions leading to a desired result.

It should be borne in mind, however, that all of these and similar terms are to be associated with the appropriate physical quantities and are merely convenient labels applied to these quantities. Unless specifically stated otherwise, as apparent from the following discussions, it is appreciated that throughout the present invention, discussions utilizing terms such as "establishing," "coupling," "monitoring," and "utilizing," or the like, refer to actions and processes (e.g. FIGS. 2-13) of back-end IC manufacturing.

Overview

Back-end IC manufacturing, in one example, refers to IC packaging and other assembly functions performed typically at or past "front-of-line" assembly time. This may include, "front-of-line" assembly, "end-of-line" assembly, "test", and/or "finish" assembly.

Embodiments of the present invention concern an integrated, software-driven, in-line module for assembling, testing and/or finishing ICs (IC's) that, in one embodiment, contains multiple substations, e.g., machines, from die attach through tape and reel (in one embodiment having a length of about 120 feet), connected with cell controllers to a higher level manufacturing execution system (MES) and factory planning information. In effect, the system works like a single assembly-test-finish equipment integrating all the individual processes into one assembly step using software and hardware integration. All this integrated equipment allows a rapid package changeover with similar package size families, allowing flexibility in production capabilities.

The present embodiment advantageously uses automated strip conveyor systems and robotic arms. In one embodiment, there is no human handling of substrate strips or IC units at all, and all human inspection, either offline or online, may be replaced with machine auto-vision. In addition to better inspection quality, machine auto vision also allows quality assurance (QA) simultaneously with production. The present embodiment simplifies the overall assembly process by eliminating offline processes and/or reducing in-line batch processes like curing, plating, and dry baking (e.g. converting such batch processes to continuous processes).

In one embodiment, the exemplary platform package may be a matrix array "die-strip" (e.g. an n-by-m matrix array of die on a single substrate, where n and m are each independently an integer of $\geqq 2$ preferably from 3 to 15, more preferably from 4 to 10) molded ball grid array (BGA) package. Array-based package-independent processing lends itself to the goals of automation and integration.

Integrated Hardware

In the following discussion, FIGS. 2-8 illustrate the hardware integration process of the present embodiment broken into four assembly portions. Including front-of-line, end-of line, test, and finish.

Figure 2:
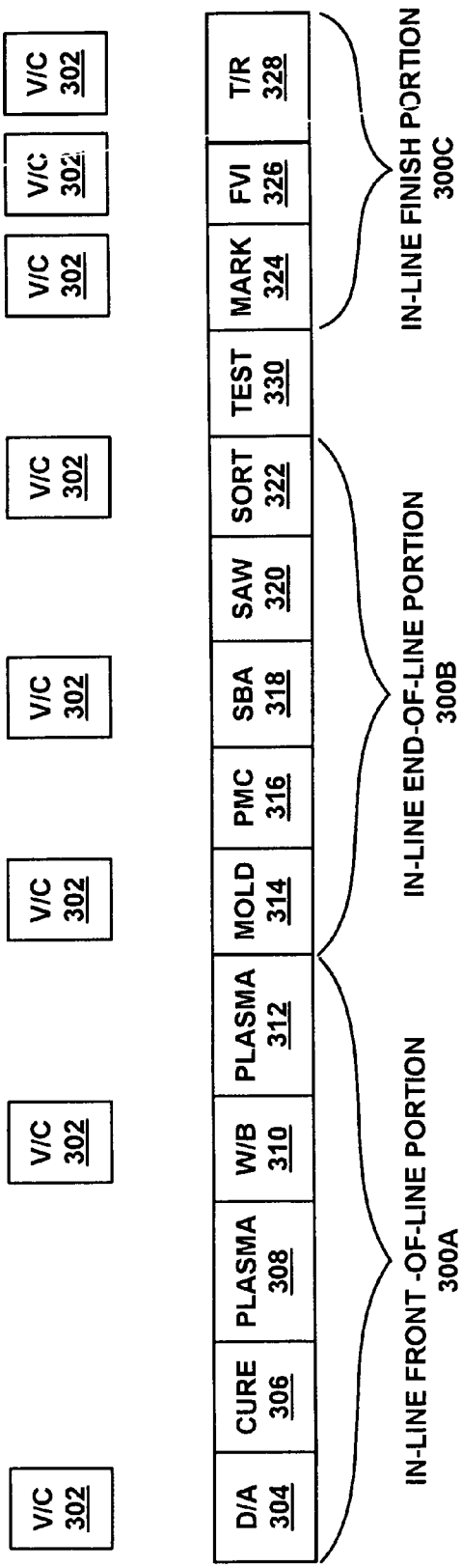
FIG. 2 is a block diagram illustrating an exemplary integrated in-line back-end IC manufacturing assembly line and assembly method in accordance with one embodiment of the present invention.

FIG. 2 is a block diagram illustrating an integrated in-line back-end IC manufacturing assembly (process) 200 in accordance with one embodiment of the present invention. FIG. 2 begins with the die attach (D/A) substation 304 that performs the D/A process and ends with tape and reel assembly 328. Any die preparation processes may be used with the present embodiment.

Figure 3A:
FIG. 3A is a block diagram illustrating an exemplary front-of-line portion of the novel integrated in-line back-end IC manufacturing line and method in accordance with one embodiment of the present invention.
Figure 3A:
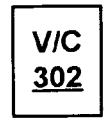
Figure 3A:
Figure 3C:
FIG. 3C is a block diagram illustrating an exemplary finish portion of the novel integrated in-line back-end IC manufacturing line and method in accordance with one embodiment of the present invention.

FIGS. 3A-3C are block diagrams illustrating more detailed versions of line 200 of FIG. 2. Specifically, FIG. 3A is front-of-line assembly portion 300A, FIG. 3B is end-of-line assembly portion 300B, and FIG. 3C is finish assembly portion 300C.

Figure 8:
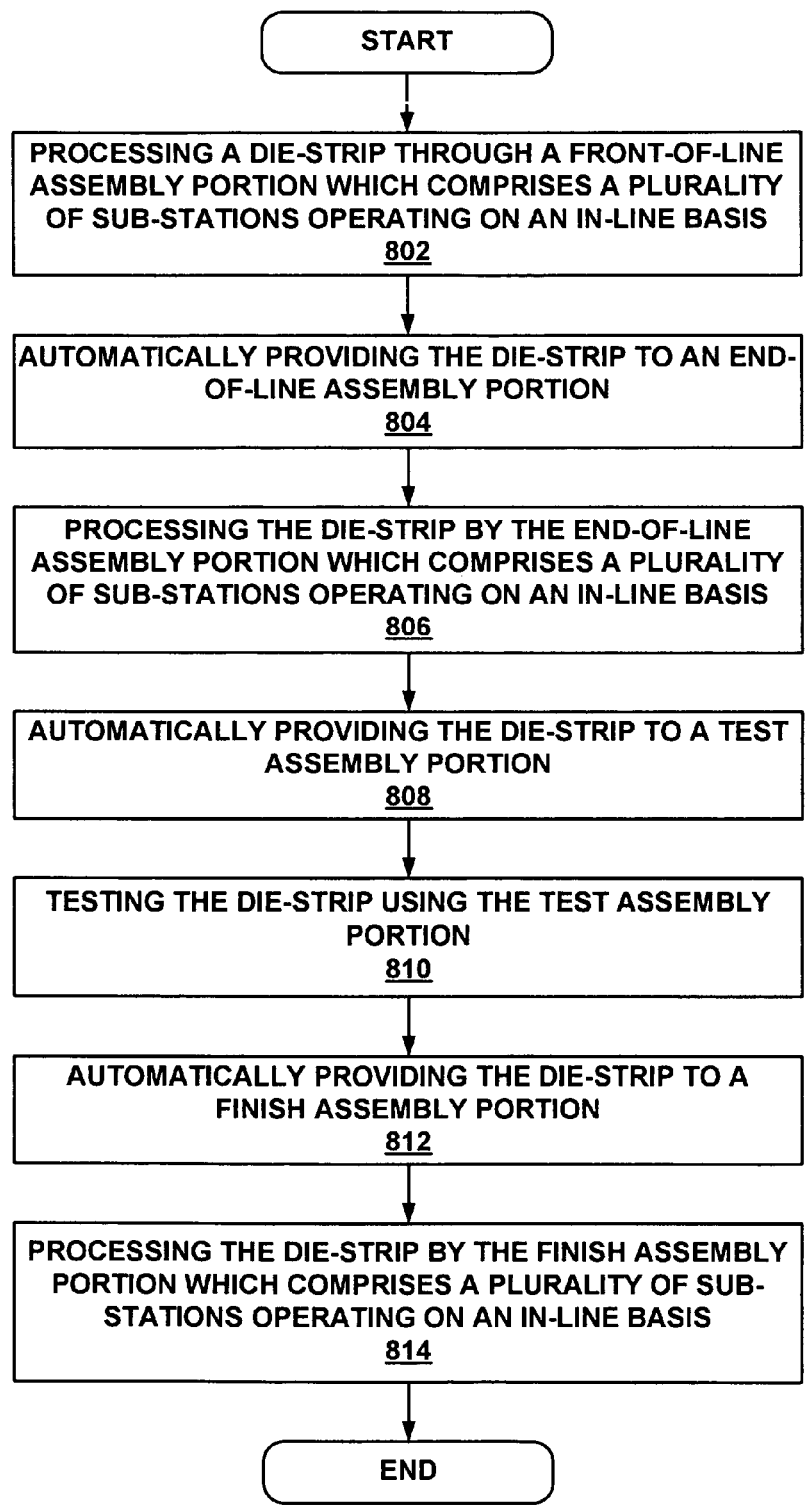
FIG. 8 is a flow chart of steps in an exemplary method for processing a chip through integrated in-line back-end IC manufacturing hardware in accordance with one embodiment of the present invention.

FIG. 8 is a flow diagram for illustrating pertinent process steps associated with line 200. With reference now to step 802 of FIG. 8 and to FIG. 3A, the present embodiment processes die-strip 400 through front-of-line assembly portion 300A. As described above, the implementation of a single die-strip 400 traveling through line 200, allows for a more personal approach to the manufacturing process. Specifically, since only a single die-strip 400 is processed through each substation, an order may be placed for a number of IC chips which is smaller than the conventional art batch size without ensuing the extraordinary costs previously associated with a small run. It is also relevant that the difference in size between a single die-strip 400 and a batch containing 50 or so die-strips, enables smaller more efficient machinery to be utilized during line 200. In general, the present embodiment processes die-strip 400 individually in an in-line fashion. Therefore, the batch process used by the conventional art is removed from the integrated in-line back-end IC manufacturing method of the present embodiment.

Now, with reference to step 802 of FIG. 8 and FIG. 3A, the front-of-line assembly portion 300A comprises a plurality of sub-stations operating on an in-line basis. In one embodiment, the plurality of sub-stations include die attach substation (D/A) 304, cure substation 306, plasma substation 308, wire bond substation (W/B) 310, and plasma substation 312. In the present embodiment, many portions of the conventional line process have been modified in order to establish an in-line assembly line format.

Figure 4:
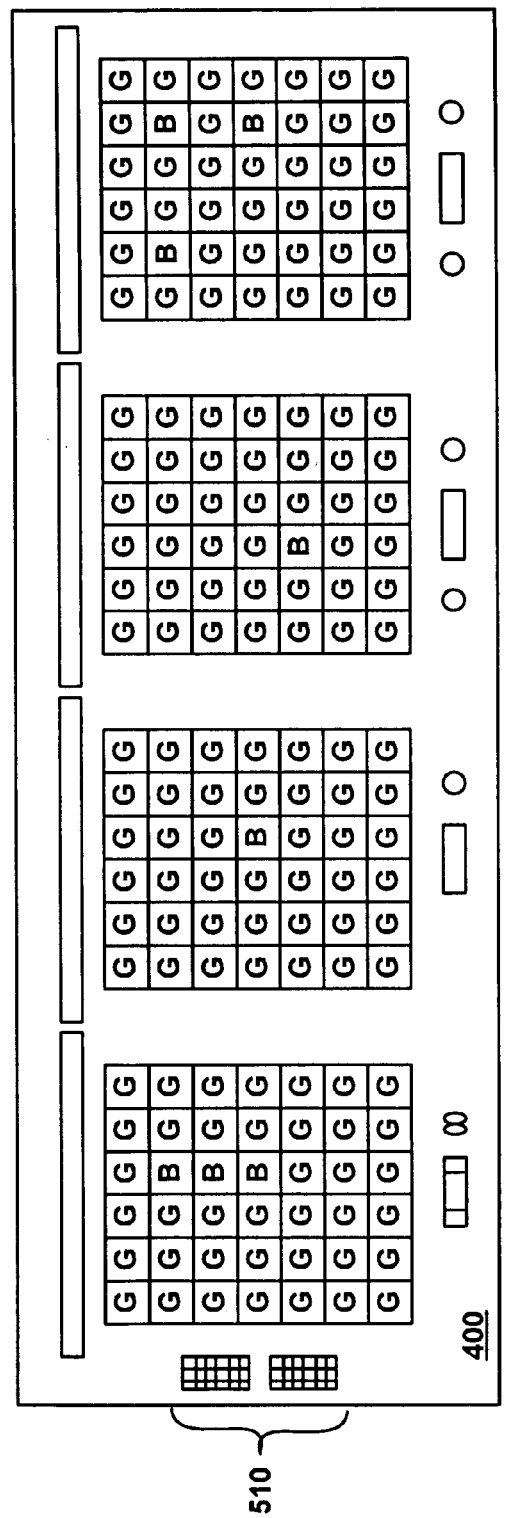
FIG. 4 is a block diagram illustrating an exemplary electronic die-strip map database in accordance with one embodiment of the present invention.

Front-of-line portion 300A receives a die-strip (an example of a die-strip 400 is illustrated in FIG. 4) at the die attach substation 304 that performs the die attach (D/A) process. However, the actual cutting and shaping of the wafer, from which die-strip 400 is formed, may take place outside of the scope of the present embodiment.

Substation 304 performs the initial processes of attaching die to a strip thereby forming a die strip 400. Specifically, D/A substation 304 attaches a die (for example, a BGA die) to die strip 400 (FIG. 4). In the present embodiment glue is used to attach die to die strip 400. The glue may be any glue utilized by one skilled in the art. It is appreciated that any well-known die preparation process may be used with the present embodiment.

The second step in front-of-line assembly portion 300A is performed by cure substation 306 that performs the cure process. In general, cure substation 306 performs an in-line process for drying the adhesive between die and substrate used in D/A substation 304. That is, die strip 400 remains at cure substation 306 until the glue is cured and die is fixedly coupled to die strip 400. The third step is plasma substation 308 that performs a plasma process. Specifically, plasma substation 308 performs an in-line cleaning substation that is applied to both sides of die strip 400 in order to clean any excess glue from die and die strip 400. In general, in-line plasma substation 308 may utilize any number of well-known cleaning processes.

The forth step in front-of-line assembly portion 300A is performed at W/B substation 310. W/B substation 310 performs an in-line process for wire bonding die strip 400. The final step in front-of-line assembly 300A is performed by plasma substation 312. Plasma substation 312 performs an in-line cleaning process applied to both sides of die strip 400 in order to clean any excess wire bonding material from die strip 400.

With further reference to step 802 of FIG. 8 and FIG. 3A, the present embodiment reduces most processing times established by the sub-stages of the conventional art. For instance, in the present embodiment, cure process and substation 306 is a snap cure which takes approximately 2 minutes. In addition, both plasma cleaning processes and substations (e.g. plasma substation 308 and plasma substation 312) have been reduced in length to approximately one minute. The reductions in processing time are a result of both the reduced processing size and in-line nature of the present embodiment. That is, since the present embodiment is applied at a die-strip 400 level and since each die-strip 400 is maintained in a controlled environment, many time consuming steps of the conventional art batch process have been reduced. Specifically, the internal areas of the in-line processing stations are reduced significantly. This reduction results in less time required for heating, venting, vacuuming, etc. Further, with no need for human interaction, the processing environment may be maintained at peak proficiency.

With further reference to step 802 of FIG. 8 and FIG. 3A, in the present embodiment human handling situations have been removed. This removal of human interaction is obtained by the implementation of specific manufacturing aspects. The first aspect is the integration of the hardware. Specifically, the integration of an in-line assembly process results in automated movement of die-strip 400 from one process to the next. The second aspect is the introduction of vision camera systems (V/C) 302 at D/A substation 304 and W/B substation 310. Specifically, V/C 302 assumes all aspects of the inspection and QA requirements previously performed by hand. Further details of V/C 302 are covered in the software process outlined herein.

With reference now to step 804 of FIG. 8 and FIG. 2, the present embodiment automatically, in an in-line fashion, provides die-strip 400 from the front-of-line assembly portion 300A to an end-of-line assembly portion 300B. Analogous to the front-of-line assembly portion 300A, the end-of-line assembly portion 300B contains many in-line substations. Also, as illustrated in the previous front-of-line assembly portion 300A, need for human interaction within the manufacturing process is eliminated.

With reference now to step 806 of FIG. 8 and FIG. 3B, the present embodiment processes die-strip 400 through the end-of-line assembly portion 300B having a plurality of sub-stations operating on an in-line basis. In one embodiment, the plurality of sub-stations in end-of-line assembly portion 300B include mold substation 314, post mold cure (PMC) substation 316, solder ball attach (SBA) substation 318, saw substation 320, and sort substation 322.

The first process in end-of-line assembly portion 300B is performed at the mold substation 314. In general, mold substation 314 utilizes a molding compound injection. Specifically, mold substation 314 is an in-line process that places a protective layer of material above die strip 400. In the present embodiment mold substation 314 may be a plastic or any other type of non-conductive material which can act as a layer of protection.

The second step in end-of-line assembly portion 300B is performed by the PMC substation 316. In general, PMC substation 316 performs an in-line process for drying the non-conductive material used at mold substation 314. That is, die strip 400 remains at PMC substation 316 until the molding material is cured, thereby ensuring that die is protectively covered on die strip 400.

The third step in end-of-line assembly portion 300B is performed at the SBA substation 318. Specifically, SBA substation 318 performs an in-line process for attaching a solder ball to die strip 400. The forth step in end-of-line assembly portion 300B is performed at the saw substation 320. Saw substation 320 performs an in-line process for cutting die strip 400. Specifically, saw substation 320 cuts die strip 400 into single components each containing a die portion.

The final step in end-of-line assembly portion 300B is performed at the sort substation 322. Sort substation 322 performs an in-line sorting process applied to each component cut from die strip 400. In general, sort substation 322 is used for separating e.g., categorizing, individual die components into accepted and rejected piles. The specifics of saw substation 320 and sort substation 322 are discussed in more detail herein. At the completion of end-of-line portion 300B, die components are provided to the tester substation 330 (FIG. 2).

With further reference to step 806 of FIG. 8 and FIG. 3B, the present embodiment both reduces and modifies most processes and times established by the conventional art, thereby allowing an efficient in-line assembly to be performed. Of particular significance, PMC substation 316 has been integrated into in-line back-end IC manufacturing line 200. Not only has PMC substation 316 been integrated into the manufacturing methodology of the present embodiment, it is used to accomplish both PMC 122 and dry bake 132 of the conventional art. Additionally, PMC substation 316 includes an annealing portion (e.g. for approx. 20 minutes) to reduce strip warpage and allow mechanical stress relief. Therefore, in the present embodiment, upon completion of a 175 degree Celsius, 5 hour PMC substation 316, die strip 400 does not require a dry bake 132. Although dry bake 132 has been removed, the resulting components are nevertheless packaged at moisture sensitivity level 3 (MSL 3). Specifically, the ability to remove dry bake 132 is due to the extremely short cycle time of line 200 following PMC substation 316. In fact, the removal of dry bake 132 advantageously reduces line 200s timeline by at least 24 hours.

Referring still to step 806 of FIG. 8 and FIG. 3B, the present embodiment establishes new methods for saw substation 320. Generally speaking, conventional saw machines were designed for 8" wafer sawing. However, the present embodiment employs n-by-m matrix array strips. Therefore, the substrate cutting length on the saw is modified (in one embodiment, to 205 mm). In another embodiment, the package sawing machine may be enhanced to allow tape-less singulation (sawing) of molded strips with a length of more than 230 mm. The present modifications achieve a higher unit density, thereby increasing the throughput of the line.

It is appreciated that V/C systems 302 are employed by the end-of-line portion 300B at the mold 314, SBA 318, and sort 322 substations. The interaction of these systems is described further to follow.

With reference now to step 808 of FIG. 8 and FIG. 2, the present embodiment automatically provides die-strip components 400 from end-of-line assembly portion 300B to a test assembly portion 330 using an in-line fashion.

With reference now to step 810 of FIG. 8 and FIG. 2, die-strip components 400 are electronically tested using test assembly portion 330. In general, test assembly portion 330 is a quality assurance measure wherein specific components are tested to ensure proper operation. Specifically, test assembly portion 330 can be used to identify a good or bad die. It may further be utilized to subdivide good die based on performance characteristics such as speed, thermodynamic values, etc. As previously stated, this is accomplished in an automated in-line fashion.

With reference now to step 812 of FIG. 8 and FIG. 2, the present embodiment automatically provides die-strip components 400 from test assembly portion 330 to a finish assembly portion 300C. As illustrated in the previous portions (e.g.

300A and 300B) the need for human interaction within the manufacturing process has been eliminated.

With reference now to step 814 of FIG. 8 and FIG. 3C, the present embodiment processes die-strip components 400 through the finish assembly portion 300C, which comprises a plurality of sub-stations operating on an in-line basis. In one embodiment, the plurality of sub-stations in finish portion 300C include mark substation 324, final visual inspection (FVI) substation 326, and tape and reel (T/R) substation 328.

In general, in-line finish portion 300C performs the final processes to the components of die strip 400. The first process of in-line finish assembly portion 300C (e.g. performed by mark substation 324) marks the components cut from die strip 400. In the present embodiment the mark is an identifying characteristic enabling the components cut from die strip 400 to be grouped into lots. The mark is aided by a visual inspection system (e.g. V/C 302) and may further contain a company logo, or any other information the manufacturer may desire.

The second step in in-line finish portion 300C is performed by the FVI substation 326. In general, FVI substation 326 performs an in-line process for performing the final visual inspection on die strip 400 components. That is, components of die strip 400 are visually inspected for many technical aspects. A few inspection requirements include assurance that components are complete, that all parts are properly protected, that the sawing process was completed correctly, etc. In the present embodiment, FVI substation 326 is performed using the aid of an in-line automated visual camera (V/C) 302.

The final step in in-line finish portion 300C is performed by T/R substation 328. T/R substation 328 performs an in-line process for packaging the components cut from die strip 400. T/R substation 328 is covered in more detail in the universal packaging section herein and uses a visual inspection system V/C 302.

In the finish assembly portion 300C, the 24-hour dry bake process of the conventional art has been removed completely. In its place, final visual inspection (FVI) substation 326 occurs. FVI substation 326 utilizes V/C 302 and the integrated software processes of line 200 to inspect the finished components prior to packaging. In one embodiment, packaging is referred to as tape and reel (T/R) substation 328 which places the individual IC chip components into compartments which are taped together and then reeled. The above-mentioned, V/C 302 and integrated software processes will be covered in more detail herein.

It is appreciated that embodiments of the present invention utilize a number of automated carriers or conveyors to move die-strips and die-strip components from one substation to another. These conveyors, and the substations themselves, are controlled by a central software application of a computer control system.

With reference still to FIG. 2, the present embodiment has reduced the overall processing time of a die strip 400 by using a completely in-line technique without human interaction. Specifically, in the conventional art, a production cycle spanned a period of four to six weeks. In the present embodiment, a production cycle takes approximately one day from D/A substation 304 to T/R substation 328. Further, the processing cycle results in an average of 3,600 units per hour for a 48-pin package. The significant increase in productivity is due to a new die-strip 400 not having to wait for a previous die-strip 400 to finish an entire processing cycle. In fact, a new die-strip 400 may enter line 200 in pipeline fashion, e.g., as soon as the previous die-strip 400 has cleared the initial processing step. Therefore, line 200 maintains an efficient, made-to-order process with die-strips being pipelined through the in-line assembly process. The present embodiment further results in lower labor costs and reduced personnel requirements due to the automation of the assembly line method.

Integrated Software Process

Figure 12:
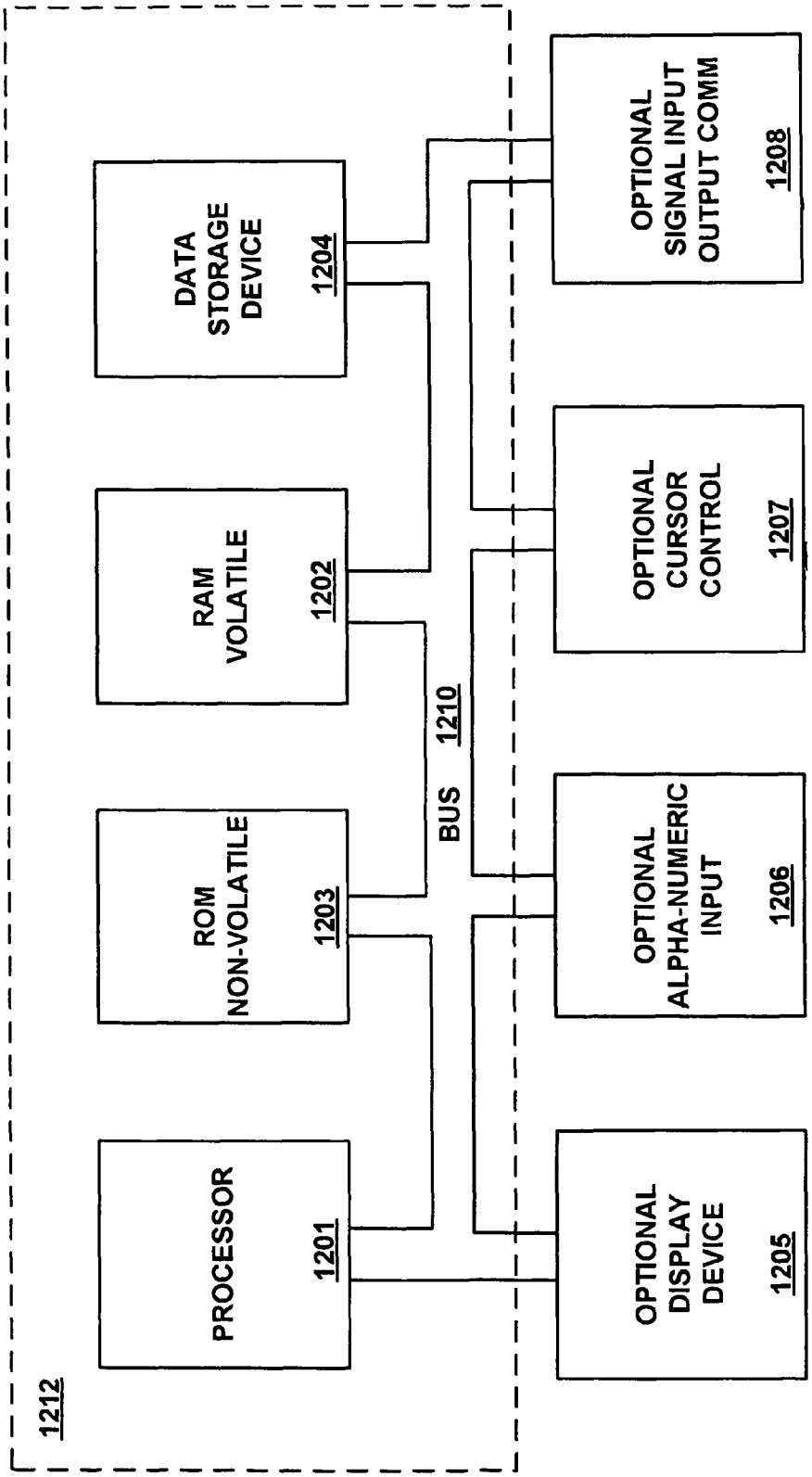
FIG. 12 is a block diagram of an exemplary general purpose computing system in accordance with one embodiment of the present invention.

With reference now to FIG. 12, portions of the present embodiment are comprised of or controlled by computer-readable and computer-executable instructions which reside, for example, in computer-usable media of a computer control system. FIG. 12 illustrates an exemplary computer system 1212 that may be used in accordance with one embodiment of the present invention. It is appreciated that system 1212 of FIG. 12 is exemplary only and that the present embodiment can operate on or within, or be controlled by, a number of different computer systems including general purpose networked computer systems, embedded computer systems, routers, switches, server devices, client devices, various intermediate devices/nodes, stand alone computer systems, and the like. Additionally, computer system 1212 of FIG. 12 is well adapted having computer readable media such as, for example, a floppy disk, a compact disc, and the like coupled thereto.

System 1212 of FIG. 12 includes an address/data bus 1210 for communicating information, and a central processor unit 1201 coupled to bus 1210 for processing information and instructions. System 1212 also includes data storage features such as a computer usable volatile memory 1202, e.g. random access memory (RAM), coupled to bus 1210 for storing information and instructions for central processor unit 1201, computer usable non-volatile memory 1203, e.g. read only memory (ROM), coupled to bus 1210 for storing static information and instructions for the central processor unit 1201, and a data storage device 1204 (e.g., a magnetic or optical disk and disk drive) coupled to bus 1210 for storing information and instructions. System 1212 of the present embodiment also includes an optional alphanumeric input device 1206 including alphanumeric and function keys coupled to bus 1210 for communicating information and command selections to central processor unit 1201. System 1212 also optionally includes an optional cursor control device 1207 coupled to bus 1210 for communicating user input information and command selections to central processor unit 1201. System 1212 of the present embodiment also includes an optional display device 1205 coupled to bus 1210 for displaying information.

Figure 9:
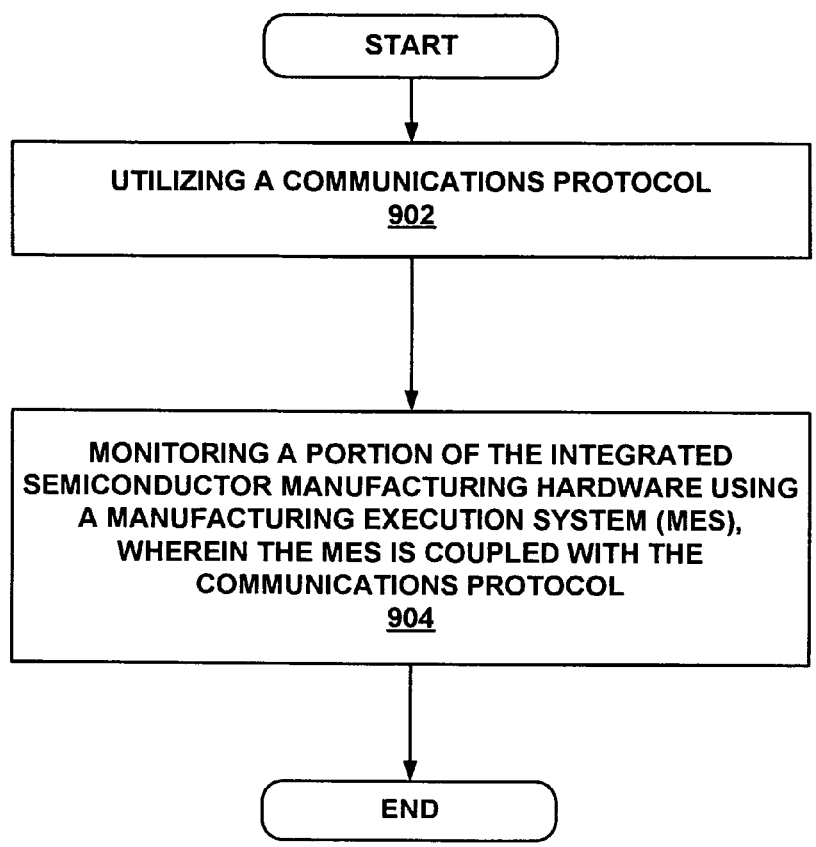
FIG. 9 is a flow chart of steps for software integration in accordance with one embodiment of the present invention.

With reference now to process 900 of FIG. 9, the present embodiment implements a software process 900 in conjunction with assembly line 200. In one embodiment, the software process 900 takes place on computer control system 1212.

Figure 6:
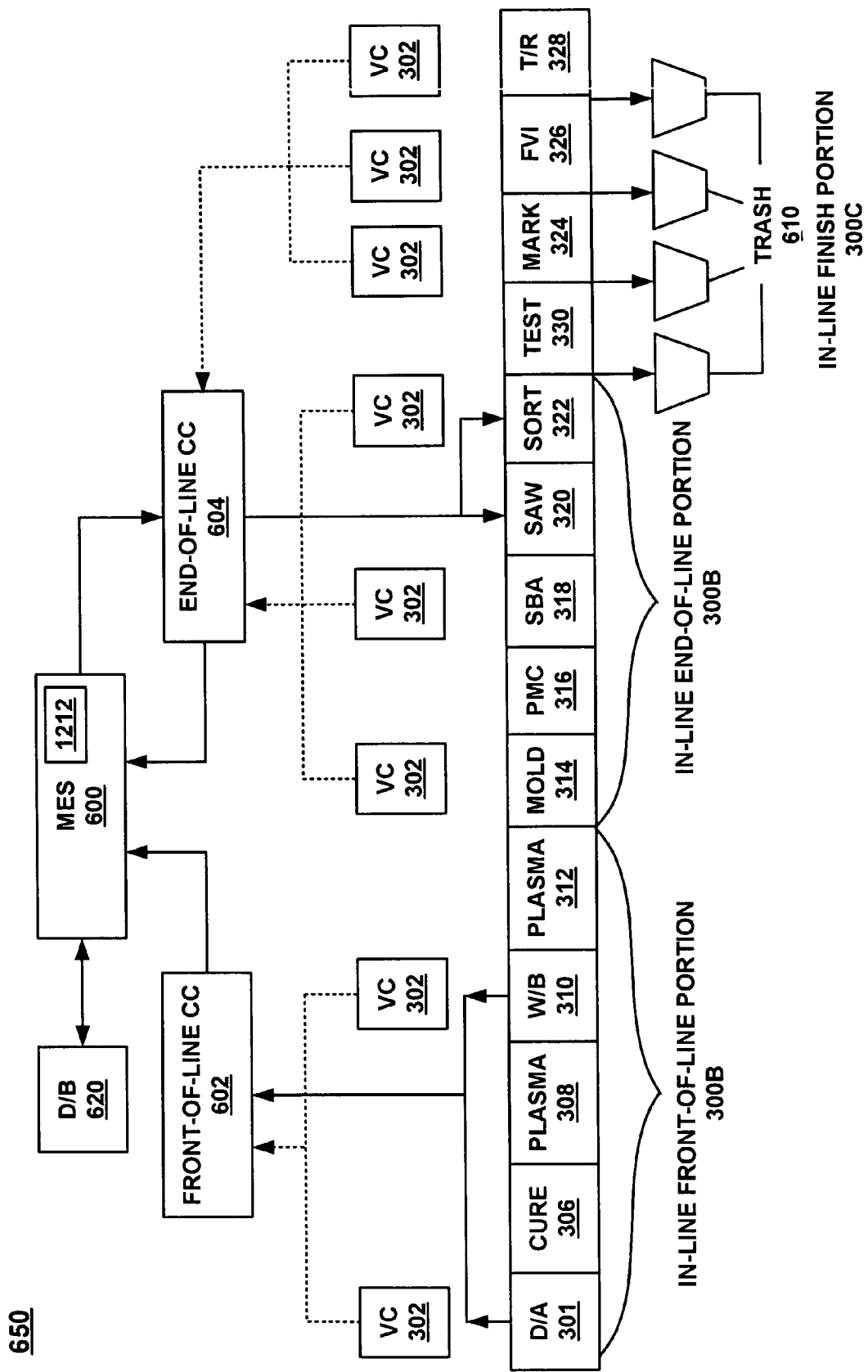
FIG. 6 is a block diagram of exemplary reject management system in accordance with one embodiment of the present invention.

With reference now to step 902 of FIG. 9 and FIG. 6, a communications protocol is utilized between system 1212 and the in-line substations to control their activity. Specifically, a standard semi equipment communications standard/generic equipment model (SECS/GEM) protocol may be used. Generally speaking, SECS is a layer 6 protocol that describes the content of the messages while GEM is a higher layer application protocol that defines the messages themselves.

With reference still to step 902 of FIG. 9 and FIG. 6, the communications protocol is utilized to provide an interface between portions of the integrated in-line back-end IC manufacturing hardware 200. In another embodiment, the communications protocol may be established within each piece of hardware on line 200. As shown in FIG. 6, the communications protocol results in a software hierarchy for line 200. In another embodiment, the software hierarchy is established to maintain overall control of line 200. Further, the communications protocol is independent of the hardware platform. Thus, compatible communication between any portion of line 200 is obtained.

With reference now to step 904 of FIG. 9 and FIG. 6, the present embodiment monitors a portion of line 200 using a manufacturing execution system (MES) 600 coupled with the communications protocol. Furthermore, MES 600 may be comprised of at least one equipment cell controller (CC). In the present embodiment, MES 600 may also be comprised of two CCs. Specifically, a portion of front-of-line hardware 300A is coupled with front-of-line equipment cell controllers (CC) 602, and a portion of end-of-line hardware 300B is coupled with end-of-line equipment CC 604. Both CC 602 and CC 604 are then coupled to communicate with MES 600 for command and control. In one embodiment, MES 600 maintains a planning database 620 which includes a die-strip map database. In another embodiment, MES 600 controls the processing activities at each substation. Accordingly, all lot movement and process-monitoring details are regularly updated to MES 600 and ultimately the planning database 620 via both CC 602 and CC 604. In another embodiment, planning database 620 is further utilized to maintain an internal planning and/or order/shipment database. However, in order to maintain comprehensive tracking of lot movement and process-monitoring details, a system to differentiate each die-strip 400 is instituted. The specifics of the system to differentiate each die-strip 400 will be discussed in detail herein.

Figure 13:
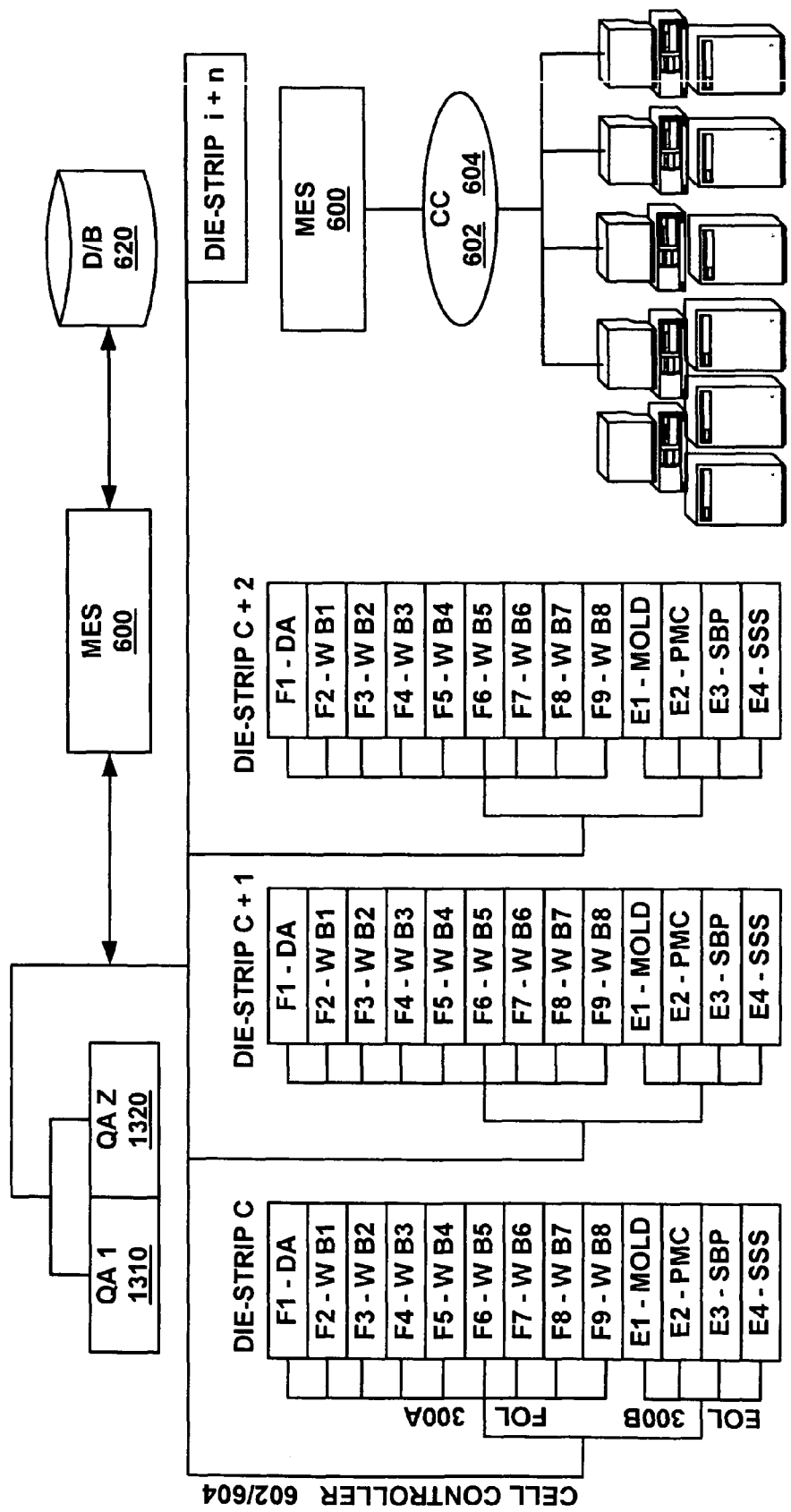
FIG. 13 is a block diagram of an exemplary method of electronic inspection and strip map database updating in accordance with another embodiment of the present invention.

A further example of multiple embodiments of the software hierarchy is illustrated in FIG. 13. Specifically, FIG. 13 is a representation of the steps taken by the visual system, e.g., V/C 302, to view the die-strip 400. The results of their inspections are collected by CC 602 and CC 604 units and are then transferred to the central MES 600 system. In one embodiment, the inspection results are further transferred to database 620. In general the three columns (e.g. die-strips i, i+1, and i+2) represent portions of a die-strip 400 die map. Specifically, boxes F1-F8 represent mapping, while E1-E4 represent other parameters collected at other visual stations. All boxes represent process history information including individual die-strip map database (e.g. 620) and inspection (e.g. quality assurance (QA) 1 1310 and QA2 1320. As stated herein, all data collected by V/C 302 systems is stored in a database that maintains each die-strip 400s' processing history. Although a specific hierarchy of computer systems is established, the present embodiment is well suited to many types of computer system hierarchy. Additionally, the present embodiment of computer system hierarchy is illustrated for purposes of clarity, not as a means of limitation.

Reject Management

In one embodiment, reject management is a portion of the in-line assembly line manufacturing process that utilizes the integrated software processes mentioned herein to determine the manufacturing status, quality, and performance of each specific die on a die-strip 400. In general, aspects of reject management detailed herein allow comprehensive tracking and quality assurance of a die-strip 400 and every die thereon ensuring a high level of "out-the-door" product quality. Reject management is dependent on accurate V/C 302 calibration and integration with the software database 620.

Figure 5:
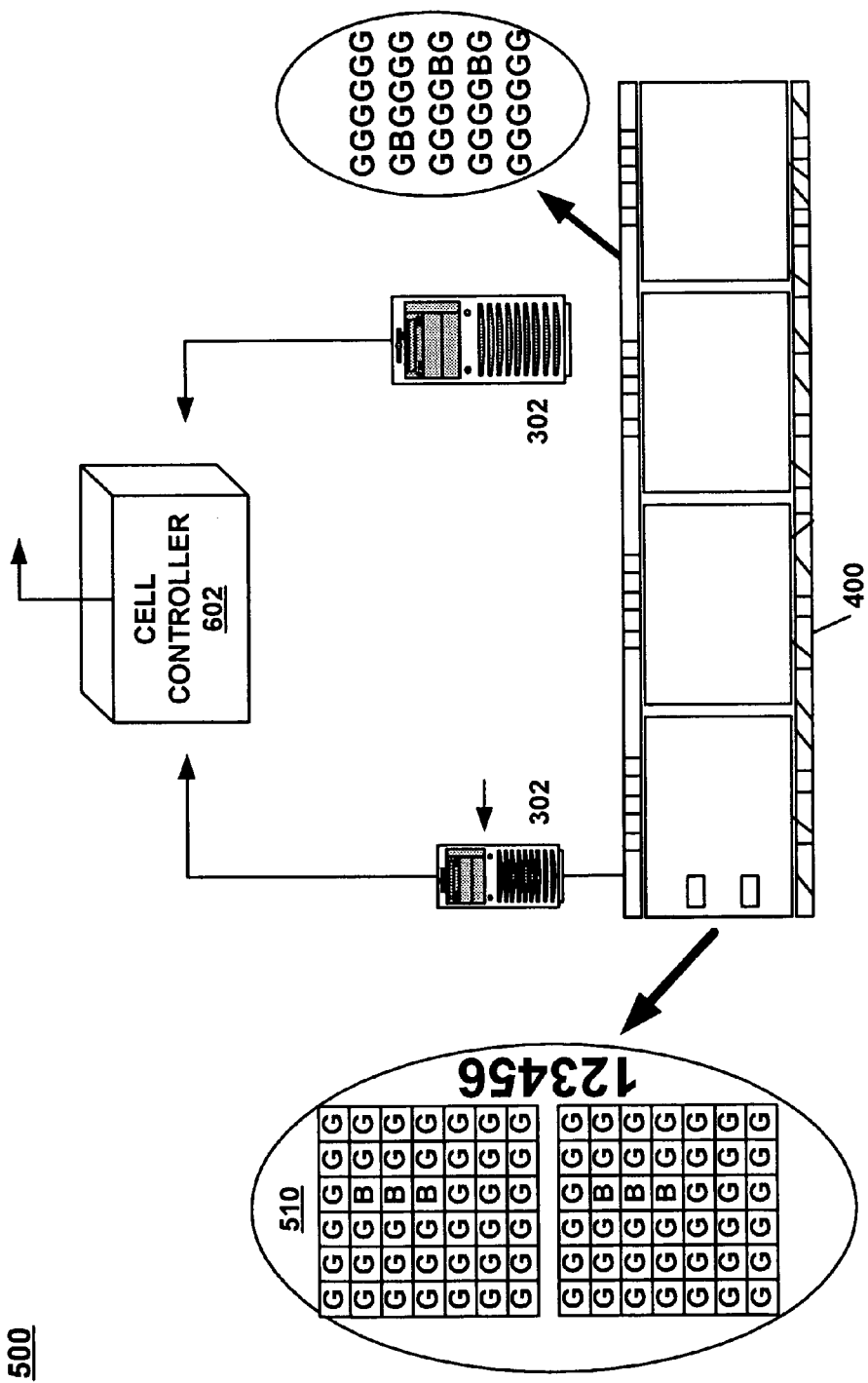
FIG. 5 is a block diagram of an exemplary process of an electronic inspection and die-strip map database updating method in accordance with one embodiment of the present invention.
Figure 10:
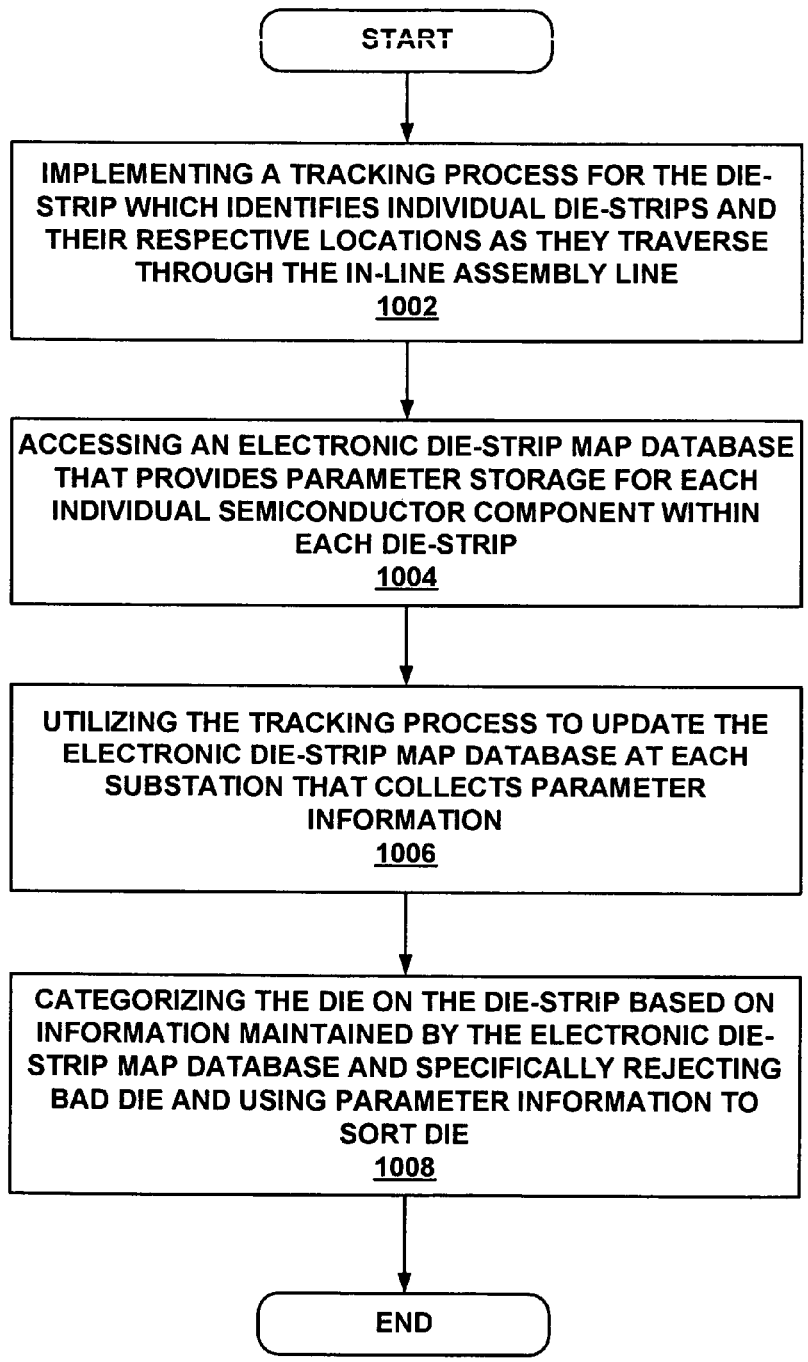
FIG. 10 is a flow chart of steps for reject management protocol used in conjunction with the in-line integrated in-line back-end IC manufacturing assembly in accordance with one embodiment of the present invention.

With reference now to step 1002 of FIG. 10 and FIG. 5, the present embodiment implements an automated and database driven tracking process for die-strip 400 which uses the camera vision systems to automatically identify individual die-strips 400 and their respective locations as they traverse through the in-line assembly line 200. In one embodiment, the tracking process starts at die attach substation 304 and is maintained throughout the entire back-end IC manufacturing process. However, in order to maintain a die-strip level tracking process, a two-dimensional code, known as data matrix 2D symbol 510 may be placed on every die-strip 400. In one embodiment, data matrix 2D symbol 510 is etched onto die-strip 400 by a laser. However any printing or affixing method could be used.

Specifically, each data matrix 2D symbol 510 utilizes a specialized 2D matrix code similar to a bar code. Data matrix 2D symbol 510 may store up to 19 characters, in one embodiment, which maintain all specific chip and lot related information. Further, a second data matrix 2D symbol 510 may also be placed on die-strip 400. This second data matrix 2D symbol 510 is analogous to the first data matrix 2D symbol 510 and may be utilized as a back up. Therefore, if any damage occurs to the first data matrix 2D symbol 510, the die-strip tracking process remains possible by utilizing back-up data matrix 2D symbol 510. In a second case, a combination of both first data matrix 2D symbol 510 and back-up data matrix 2D symbol 510 may be used for tracking recognition purposes.

With reference now to step 1004 of FIG. 10 and FIG. 6, the present embodiment accesses an electronic die-strip map database 620 that provides parameter storage for each individual IC component within each die-strip 400. In one embodiment, the electronic die-strip map database 620 is located in memory on MES 600. In general, the electronic die-strip map database 620 maintains a record of each die-strip 400 traversing the individual substations of the manufacturing process. Specifically, the electronic die-strip map database 620 maintains information relative to the die-strip level as well as information regarding inspection and processing at the individual die level.

An example of the electronic die-strip map database 620 is illustrated in FIG. 4. Specifically, a single die-strip 400 is shown in a visual representation of the electronic die-strip map database 620. The database 620 records parameters for each chip on the die-strip 400 and these parameters are updated as the die strip traverses through the manufacturing process thereby providing a process history for the die-strip 400. For instance, 164 individual die are illustrated on a matrix substrate, or leadframe, in an array-like structure on die-strip 400. On each die a representative letter is shown as a parameter within a designated die block. In one embodiment, the letter is either a G or a B. Specifically, G is a reference to good, while B is a reference to bad.

During the manufacturing process, any changes to the status of a specific die are updated by the electronic die-strip map database 620. A negative update to the strip map would result in a change on die-strip 400 from a die block being designated with a G to a new designation of B. The designations of G and B are simplified examples of an actual electronic die-strip map database 620. Further, any representation resulting in differentiation between satisfactory and unsatisfactory die located on die-strip 400 may be utilized by the present embodiment. A further example of differentiation is the parameter of test speed. For instance, the die-strip map database 620 could also categorize die based on performance data, such as speed, etc.

With reference now to step 1006 of FIG. 10 and FIG. 5, the present embodiment utilizes the tracking process to update the electronic die-strip map database 620 at each substation that collects parameter information throughout the manufacturing process. Specifically, die-strip 400 is analyzed at each key process by V/C 302. In one embodiment, V/C 302 is used to inspect a portion of the die on die-strip 400 for physical attributes. Parameters are then updated for each die in the database 620. In another embodiment, V/C 302 is used as a data matrix 2D symbol 510 reader for location determination by identifying the die-strip 400. For example, the analysis of die-strip 400 in a front-of-line portion 300A is conducted by V/C 302. Further, the data matrix 2D symbol 510 on the same die-strip 400 is read by V/C 302. The results of both V/C 302 processes are reported to CC 602. CC 602 then passes the information to the electronic die-strip map database 620 located on MES 600. This information is then processed by the electronic die-strip map database 620. In so doing, the updated electronic die-strip map database 620 will continue to maintain a positive track of a portion of the die on die-strip 400.

Although in the present embodiment V/C 302 are used as a data matrix 2D symbol 510 reader, a distinct 2D code reader may be installed at the strip entry point of a substation of processing equipment that will update and/or use the strip map database 620. The utilization of V/C 302 as the 2D code reader and die-strip 400 inspector are merely for purposes of brevity. It is further appreciated that each automated V/C 302 may be independent from, or in electronic communication with, any or all other automated V/C 302.

With reference still to step 1006 of FIG. 10 and FIG. 5, in the present embodiment V/C 302, the tracking process, and the electronic die-strip map database 620 are the tools that have improved the tracking, inspecting, and dehumanization of the back-end IC manufacturing process. Specifically, the reliability of V/C 302 in the electronic die-strip mapping process is important. V/C 302 is utilized for data matrix 2D symbol 510 reading and verification. For example, V/C 302 automatically recognizes the die-strip 400 by reading the data matrix 2D symbol 510 at different points throughout the in-line manufacturing process. V/C 302 is further used for visually inspecting die-strip 400 and the die thereon throughout the in-line manufacturing process. Specifically, the present embodiment uses V/C 302 inspection after some of the major process steps, for example, die attach substation 304, W/B substation 310, mold substation 314, SBA substation 318, and saw substation 320. In another embodiment, V/C 302 inspection is used after all of the major process steps. Accordingly, utilizing V/C 302 for both inspection of die-strip 400 and a portion of the die on die-strip 400, as previously stated, allows the present embodiment to replace human inspectors with automated inspection techniques. As a result, completion times of the in-line assembly line process are markedly improved.

There are many reasons why automated inspection is preferred to human inspection. A major reason is the quantity of inspection capabilities. In the conventional process, initial human inspection is conducted on a portion of the batch. Each initial human inspection is then followed by a human QA inspection of a smaller portion of the same batch. This redundancy is established to ensure a quality product. However, in one embodiment of the present invention, all of the die on each die-strip 400 may be inspected. Thus, a complete inspection capability is obtained. Such a capability allows for higher product reliability.

A second reason for automation is the specific inspection method. In human inspection, each inspector brings a personality to the inspection process. Further, the inspection station has rotating personnel. Therefore, the inspection techniques differ per inspector. In an automated inspection process, no personality is involved and V/C 302 is in constant operation. Further, each V/C 302 is calibrated and all V/C 302 maintain a similar standard for inspection.

A third reason for automation over human inspection is the contact factor. For example, when a human inspects a batch, purposeful or incidental contact of either die-strip 400 or a die thereon may occur during the inspection process. With an automated inspection system, there is no need for V/C 302 to make any sort of contact with die-strip 400 or any die thereon. Thus, all incidental damage caused by the inspector or the inspection is removed.

Therefore, it is appreciated that each of the preceding aspects of automated inspection result in an increase in productivity. Additionally, an increase in quality and quantity of product is realized due to better inspection practices. A further benefit is the reduction of collateral damage due to the removal of any incidental human contact.

With reference now to step 1008 of FIG. 10 and FIG. 6, the present embodiment categorizes the die on die-strip 400 based on information maintained by the electronic die-strip map database 620. Specifically, the electronic die-strip map is continuously updated at each inspection step, on the die-strip map server by V/C 302. Thus, the electronic die-strip map database 620 maintains the complete processing history of die-strip 400. This map database 620 can then be used to physically separate die into bins of similar categories.

Figure 7:
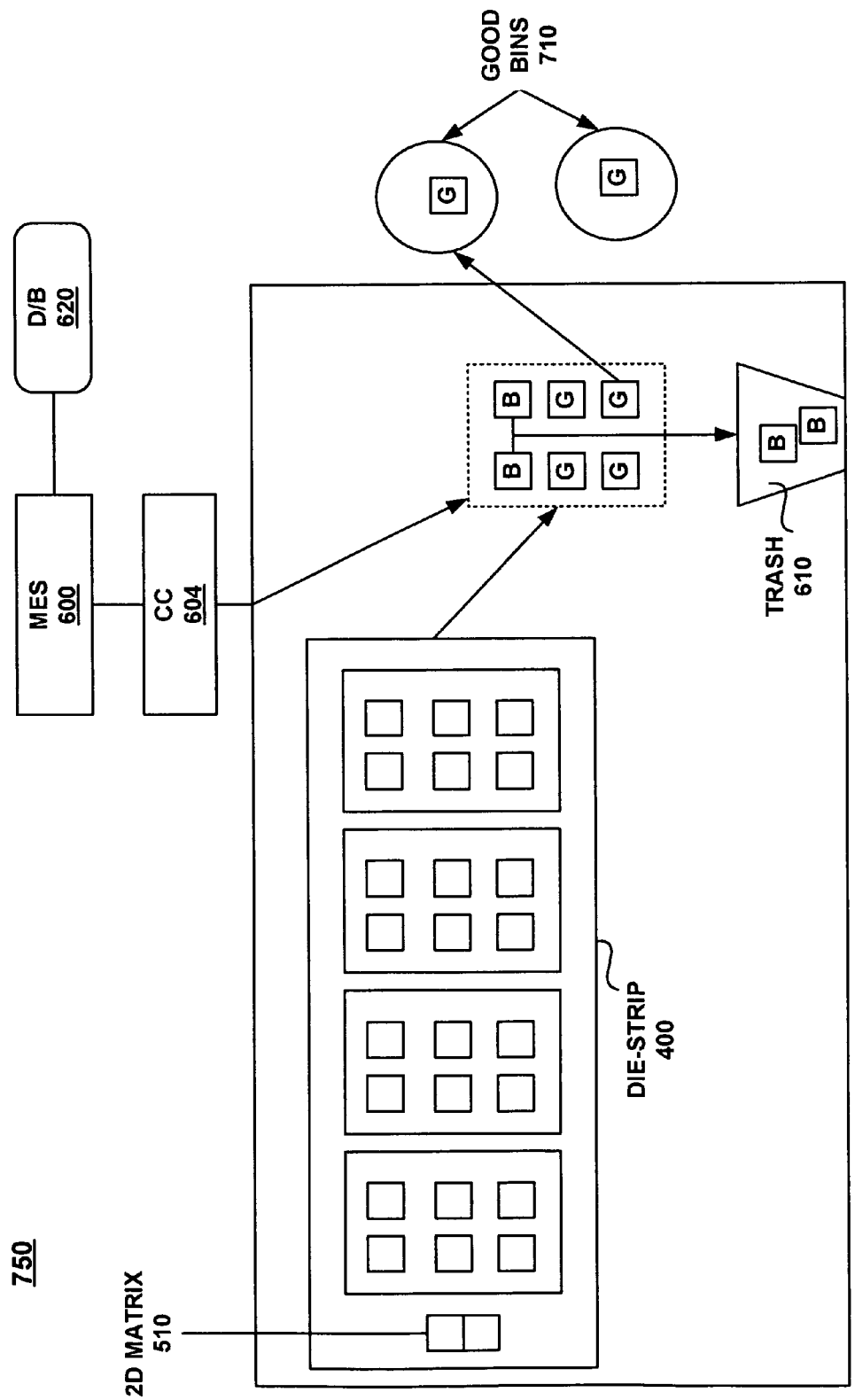
FIG. 7 is a block diagram illustrating an exemplary reject management and sorting system in accordance with another embodiment of the present invention.

Therefore, with reference to FIGS. 6 and 7, when die-strip 400 reaches saw substation 320 and sort substation 322, the electronic die-strip map is downloaded and the information is used to automatically sort and reject the designated "bad" units. Sorting may be performed based on any managed parameters. Specifically, the reject management protocols utilize the electronic die-strip map database 620 categories and either accept or reject each die. In another embodiment, subsequent rejection processes take place following the testing, marking, and final visual inspection steps of the integrated in-line IC assembly method. At each rejection evaluation, accepted units continue the process while any rejected units are automatically placed in reject bins 610. Further, it is possible for the electronic die-strip map database 620 to isolate specific rejected units on die-strip 400 early in the in-line manufacturing process such that no further back-end IC manufacturing processes are performed on the rejected units. In fact, rejected components, which are identified early in the manufacturing process, remain in their rejected state on die-strip 400 until reaching sort substation 322. At that point, all rejected units are deposited in reject bins 610. Thus, valuable manufacturing materials are saved for use on accepted units. In one embodiment, when a unit has passed all required evaluations and completed the tape and reel substation 328 of the in-line assembly process, the reel is then placed in a good bin 710.

With reference still to step 1008 of FIG. 10, the present embodiment further utilizes the electronic die-strip map database 620 to establish a processing history for tracking material usage and equipment details, and preventing the mixing of chips. Another added benefit of having a processing history, are the improved defect analysis features. Specifically, the processing history may be used to isolate exact areas within die-strip 400 or a substation of the integrated in-line back-end IC manufacturing process correlated with recurring defects. Thus, it is then possible to establish preventive maintenance techniques, such as, statistical process control (SPC) which predict and identify/repair these defective zones thereby increasing productivity.

Universal Packaging

In one embodiment, universal packaging is a portion of the in-line assembly line manufacturing process which utilizes updated subassemblies mentioned herein in accordance with the integrated software processes disclosed. In general, aspects of universal packaging detailed herein allow package changeovers with minimal changeover times, thus allowing some amount of flexibility within package families. For example, an exemplary changeover in the entire line from a 7 mm×7 mm package to any other package size may take less than thirty minutes.

Figure 11:
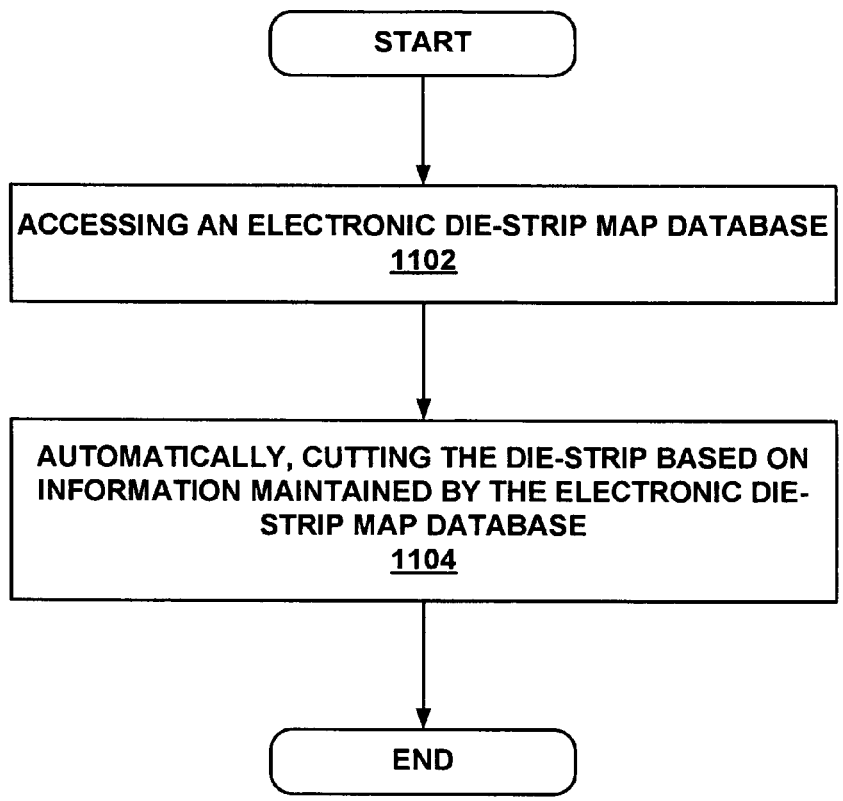
FIG. 11 is a flow chart of steps in an exemplary method for universal packaging in accordance with one embodiment of the present invention.

With reference now to step 1102 of FIG. 11 and FIG. 6, an electronic die-strip map database 620 is accessed. Specifically, mold 314 of portion 300B is established as the introductory point, in process 650, for the universal packaging process. As stated above, mold 314 is the step in the back-end IC manufacturing process wherein the die above die-strip 400 is covered in a protective coating. In one embodiment, the protective coating is a type of plastic. Moreover, the protective coating is placed in a specific location on die-strip 400. That is independent of any actual die shape. In fact, mold 314 is a standard process applied to each die-strip 400. As such, there is no need for modification of mold 314 process per specific die size run. Thus, any mechanical or manufacturing modifications required by mold 314 are reduced. Specifically, as long as the size of die-strip 400 remains constant, the size of the die on die-strip 400 is immaterial. In addition, die-strip 400 may utilize either plastic or copper as the strip portion for die attachment without any detrimental effects.

With further reference to process 1102 of FIG. 11 and FIG. 6, the integrated solder ball attach (SBA) substation 318 process is also universal. That is, in the present embodiment, SBA substation 318 process is independent of solder ball type. The specific choice is related to outside manufacturing costs and desired integrated chip requirements. In general, the integrated in-line back-end IC manufacturing process SBA substation 318 is similar in process to mold 314. That is, SBA substation 318 is also used at die-strip 400 level. Therefore, no matter what size die is above die-strip 400, SBA substation 318 uses the same universal attachment method. Because of the universality of SBA substation 318, there is no need to retool SBA substation 318 in order to process a different size die as long as die-strip 400 remains constant.

With reference now to step 1104 of FIG. 11 and FIG. 6, die-strip 400 is automatically cut based on information maintained by the electronic die-strip map database 620. Specifically, due to the universality of both mold 314 and SBA 318 substations, die-strip 400 arrives at saw substation 320 in a uniform format. Saw substation 320 then requires specific instructions about the die specifications in order to cut die-strip 400 without damaging any individual die thereon. Specifically, saw substation 320 is informed of the specific cutting specifications by the electronic strip-map database 620. As stated above, the electronic strip-map database 620 maintains the complete strip processing history of die-strip 400. Hence, when saw substation 320 receives the cutting specifications, it is able to cut die-strip 400 into the specified components without any human interaction while maintaining the integrated assembly line back-end IC manufacturing format. The resulting cut die components are then individually packaged at T/R substation 328 using, in one embodiment, the industry standard quad flat packaging with no lead (QFN).

Thus, the present invention provides, in various embodiments, a method and system for controlling the processing of a IC chip assembly line using a central computer system and a common communication protocol. Embodiments of the present invention also include a method and system for controlling the processing of a IC chip assembly line using a central computer system and a common communication protocol which can proficiently perform back-end IC manufacturing in an in-line fashion. The present invention further provides a method and system for controlling the processing of a IC chip assembly line using a central computer system and a common communication protocol which can curtail human visual inspection and QA process by using automated vision systems to maintain a higher quality of visual inspection. The present invention also provides a method and system for controlling the processing of a IC chip assembly line using a central computer system and a common communication protocol which is compatible with existing back-end IC manufacturing processes.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

What is claimed is:

1. A computer control system for a back-end assembly line for IC assembly comprising:

a plurality of integrated substations comprising a front-of-line portion, an end-of-line portion, a test portion, and a finish portion, each substation operable to process a die-strip in an in-line and pipelined fashion such that a first substation processes a first die-strip while a second substation processes a second die-strip, wherein each die-strip comprises a strip and a plurality of dies attached to said strip;

a plurality of automated vision camera systems disposed at said plurality of substations for automatically examining each die-strip, wherein a first automated vision camera system is disposed at said front-of-line portion, a second automated vision camera system is disposed at said end-of-line portion, and a third automated vision camera system is disposed at said finish portion;

a central computer system coupled to said plurality of automated vision camera systems and coupled to said plurality of substations, said central computer system for collecting information from said plurality of automated vision camera systems and for controlling traversal and processing of each die-strip through said plurality of substations in an in-line and pipelined fashion using a common communication protocol; and a database coupled to said central computer system, wherein said database stores said collected information from said plurality of automated vision camera systems, and wherein said database stores a map representation of each die-strip for maintaining details of each die of each die-strip.

2. A system as described in claim 1 wherein said central computer system is a manufacturing execution system (MES).

3. A system as described in claim 2 wherein said common communication protocol is a version of the standard semi equipment communications standard/generic equipment model (SECS/GEM).

4. A system as described in claim 1 further comprising an equipment cell controller coupled between said plurality of automated vision camera systems and said central computer system and for transferring information therebetween.

5. A system as described in claim 4 wherein said equipment cell controller is also coupled between said central computer system and said plurality of substations for providing communication therebetween.

6. A system as described in claim 1 wherein said plurality of substations comprise:
a first equipment cell controller coupled between said central computer system and a first portion of said plurality of automated vision camera systems of said front-of-line portion and for providing communication therebetween; and
a second equipment cell controller coupled between said central computer system and a second portion of said plurality of automated vision camera systems of said end-of-line portion and for providing communication therebetween.

7. A system as described in claim 6 wherein:
said central computer system is also for communicating first commands and data to said first equipment cell controller to control said front-of-line portion of said plurality of substations; and
said central computer system is also for communicating second commands and data to said second equipment cell controller for controlling said end-of-line portion of said plurality of substations.

8. A system as described in claim 1 wherein said central computer system is also for determining a location of each die-strip by one of said automated vision camera systems reporting an identification of a unique code associated with each die-strip.

9. A system as described in claim 1 wherein:
said end-of-line portion is integrated with said front-of-line portion;
said test portion integrated with said end-of-line portion; and
said finish portion integrated with said test portion.

10. A system as described in claim 9 wherein said front-of-line portion comprises: a die-attach substation; a cure substation; a first plasma substation; a bond substation and a second plasma substation.

11. A system as described in claim 9 wherein said end-of-line portion comprises: a mold substation; a post mold cure substation; a solder ball attach substation; a saw substation; and a sort substation.

12. A system as described in claim 9 wherein said finish portion comprises: a marking substation; a final visual inspection substation; and a tape and reel substation.

13. A system as described in claim 1 wherein said common communication protocol is a version of the standard semi equipment communications standard/generic equipment model (SECS/GEM).

14. A system as described in claim 13 wherein said SECS/GEM communication protocol is established in a hierarchical format.

15. A computer control system for a back-end IC device assembly line comprising:
a plurality of integrated substations comprising a front-of-line portion, an end-of-line portion, a test portion, and a finish portion, each substation operable to process a die-strip in an in-line and pipelined fashion such that a first substation processes a first die-strip while a second substation processes a second die-strip, wherein each die-strip comprises a strip and a plurality of dies attached to said strip;
a plurality of automated vision camera systems disposed at said plurality of substations for automatically examining each die-strip, wherein a first automated vision camera system is disposed at said front-of-line portion, a second automated vision camera system is disposed at said end-of-line portion, and a third automated vision camera system is disposed at said finish portion;
a manufacturing execution system (MES) coupled to said plurality of automated vision camera systems and coupled to said plurality of substations, said MES for collecting information from said plurality of automated vision camera systems and for controlling traversal and processing of each die-strip through said plurality of substations in an in-line and pipelined fashion using commands and data communicated using a common communication protocol being a version of the standard semi equipment communications standard/generic equipment model (SECS/GEM); and
a database coupled to said MES, wherein said database stores said collected information from said plurality of automated vision camera systems, and wherein said database stores a map representation of each die-strip for maintaining details of each die of each die-strip.

16. A system as described in claim 15 wherein said plurality of substations further comprise:
a first equipment cell controller coupled between said MES and a first portion of said plurality of automated vision camera systems of said front-of-line portion and for providing communication therebetween; and
a second equipment cell controller coupled between said MES and a second portion of said plurality of automated vision camera systems of said end-of-line portion and for providing communication therebetween.

17. A system as described in claim 16 wherein:
said MES is also for communicating first commands and data to said first equipment cell controller to control said front-of-line portion of said plurality of substations; and
said MES is also for communicating second commands and data to said second equipment cell controller for controlling said end-of-line portion of said plurality of substations.

18. A system as described in claim 15 wherein said MES is also for determining a location of each die-strip by one of said automated vision camera systems reporting an identification of a unique code associated with each die-strip.

19. A system as described in claim 15 wherein:
said end-of-line portion is integrated with said front-of-line portion;
said test portion is integrated with said end-of-line portion; and
said finish portion is integrated with said test portion.

20. A system as described in claim 19 wherein said front-of-line portion comprises: a die-attach substation; a cure substation; a first plasma substation; a bond substation and a second plasma substation.

21. A system as described in claim 19 wherein said end-of-line portion comprises: a mold substation; a post mold cure substation; a solder ball attach substation; a saw substation; and a sort substation.

22. A system as described in claim 19 wherein said finish portion comprises: a marking substation; a final visual inspection substation; and a tape and reel substation.

23. A system as described in claim 15 wherein said SECS/GEM communication protocol is established in a hierarchical format.

* * * * *